(12) United States Patent
Wang et al.

(10) Patent No.: US 8,537,874 B2
(45) Date of Patent: Sep. 17, 2013

(54) HIGH FILL-FACTOR EFFICIENT VERTICAL-CAVITY SURFACE EMITTING LASER ARRAYS

(75) Inventors: Chad Wang, Santa Barbara, CA (US); Jonathan Geske, Venture, CA (US)

(73) Assignee: Flir Systems, Inc., Wilsonville, OR (US)

( * ) Notice: Subject to any disclaimer, the term of this patent is extended or adjusted under 35 U.S.C. 154(b) by 0 days.

(21) Appl. No.: 12/914,146

(22) Filed: Oct. 28, 2010

(65) Prior Publication Data
US 2012/0106585 A1 May 3, 2012

(51) Int. Cl.
*H01S 3/08* (2006.01)
(52) U.S. Cl.
USPC .................. 372/103; 372/50.12; 372/50.124
(58) Field of Classification Search
USPC .................. 372/50.12, 50.124, 103
See application file for complete search history.

(56) References Cited

U.S. PATENT DOCUMENTS

| | | | |
|---|---|---|---|
| 6,304,588 B1* | 10/2001 | Chua et al. | 372/46.013 |
| 2004/0037337 A1* | 2/2004 | Jagadish et al. | 372/46 |
| 2005/0019973 A1* | 1/2005 | Chua | 438/42 |
| 2011/0058587 A1* | 3/2011 | Sakurai et al. | 372/46.01 |

\* cited by examiner

*Primary Examiner* — Yuanda Zhang
(74) *Attorney, Agent, or Firm* — Haynes and Boone, LLP (57) ABSTRACT

An array of vertical-cavity surface emitting lasers (VCSELs) may be fabricated with very high fill-factors, thereby enabling very high output power densities during pulse, quasi-continuous wave (QCW), and continuous wave (CW) operation. This high fill-factor is achieved using asymmetrical pillars in a rectangular packing scheme as opposed prior art pillar shapes and packing schemes. The use of asymmetrical pillars maintains high efficiency operation of VCSELs by maintaining minimal current injection distance from the metal contacts to the laser active region and by maintaining efficient waste heat extraction from the VCSEL. This packing scheme for very high fill-factor VCSEL arrays is directly applicable for next generation high-power, substrate removed, VCSEL arrays.

11 Claims, 8 Drawing Sheets

Layer 315 prior to aperture formation

Cross section (at line 99) of VCSEL

HIGH FILL-FACTOR EFFICIENT VERTICAL-CAVITY SURFACE EMITTING LASER ARRAYS

FIELD

Embodiments of the invention generally pertain to vertical-cavity surface emitting lasers (VCSELs), and more particularly to VCSEL aperture designs to increase efficiency and fill-factor.

BACKGROUND

Vertical-cavity surface emitting lasers (VCSELs) emit light perpendicular to the surface of the wafer plane. The structure of VCSELs allows for manufacturing advantages over the structure of edge-emitting lasers, such as fabricating complete individual VCSELs simultaneously on a single semiconductor wafer. These manufacturing advantages lead to efficiency and cost savings during fabrication while permitting each laser to be individually testable in situ. VCSELs are also easily fabricated into two-dimensional (2D) arrays, wherein each laser is individually controllable.

Currently, VCSELs and VCSEL arrays are used primarily for lower-power applications, such as in short-reach datacom (850 and 980 nm), telecommunications (1300-1550 nm), optical mice, and spectroscopy. Applications such as optical pumping, industrial cutting, medical and defense applications require the use of high power lasers. High power lasers have been dominated by edge-emitting lasers that have a high percentage of their emitting area consumed by laser apertures (e.g., through the use of longer cavity lasers, broad area lasers arranged in parallel bars, serial laser bar stacking).

Thus, obtaining high power density from a VCSEL array requires a combination of characteristics from the array. These characteristics include highly efficient laser diode pixels, effective thermal managements and waste heat extraction, low resistance electrical current injection, and a high fill-factor of VCSEL pixels in the array.

Increasing the fill-factor of VCSEL pixels in an array cannot be effectively accomplished by making an extremely large aperture for each VCSEL of a 2D array (or, simply having a single VCSEL with an extremely large aperture consuming most of the area of a wafer). It is understood that, for thermal reasons, smaller pixels more easily dissipate heat than a larger aperture device; the hottest center part of the smaller aperture VCSEL is closer to the cooler edge of the laser than for a larger aperture VCSEL. For this reason, larger pixels suffer a decline in performance because the center part of their apertures operates hotter than those of smaller pixels. Lateral electrical series resistance accounts for the majority of the rest of the reduction in series resistance as aperture diameters increase. As a result, larger diameter devices with top ring metal contacts suffer non-uniform current injection due to lateral resistance and thus suffer a decline in performance.

Furthermore, solutions increasing the number of VCSELs in a 2D array while simultaneously making the apertures smaller are unsatisfactory, as VCSELs with apertures having a diameter smaller than 3 μm are less efficient due to optical scattering from the edge current confinement areas separating each VCSEL.

Figure 1:
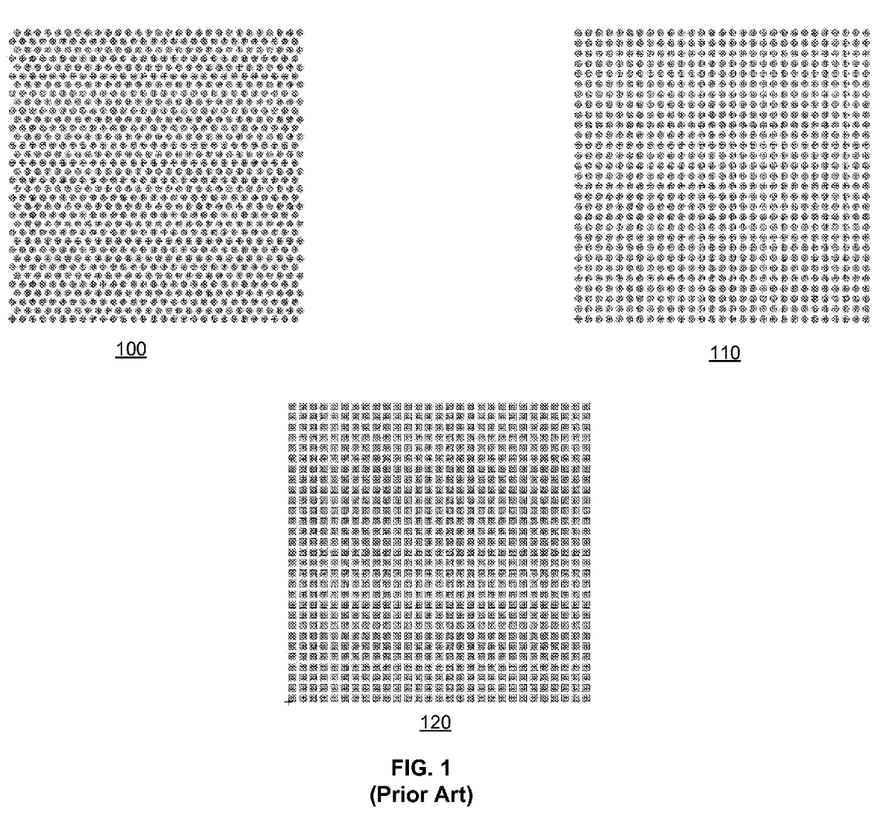
FIG. 1 is an illustration of prior art packing schemes for 2D VCSEL arrays.

Prior art VCSEL packing layouts also restrict the fill-factor of wafers including 2D VCSEL arrays. Prior art packing layouts, as illustrated in FIG. 1, include hexagonal packing with circular-shaped VCSEL pillars 100, square packing circular pillars 110, and square packing with square-shaped VCSEL pillars 120.

Thus, if high efficiency is needed to achieve high power VCSEL arrays, a method of producing higher fill-factor VCSEL arrays using high efficiency individual devices is needed.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "In an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the present invention relate to a plurality of VCSEL pixels formed on a semiconductor region. Each VCSEL formed on the semiconductor region includes an aperture having a length and a width of unequal value. Descriptions below refer to the length being greater than the width. It is to be understood that said descriptions are not to be read as limiting the orientation or shape of embodiments of the invention, but merely to point out the apertures of VCSELs are of non-circular, non-regular shapes (hereinafter referred to as 'asymmetrical').

Embodiments of the invention may include VCSELs (e.g., top-emitting, bottom-emitting) having asymmetric apertures with, for example, a relatively rectangular or oval shape. It is to be understood that this approach allows for an increased fill-factor—i.e., a larger fraction of the array area is filled with light emitting electrically pumped active region material, as the total amount of emitting area is affected by the longer length of the aperture. It is also to be understood that the shorter width of the aperture still determines the shortest possible length of current injection to the center of the aperture and waste heat extraction from the center of the aperture.

Embodiments of the invention further describe several packing arrangements for asymmetrical VCSELs of a 2D array. In one embodiment, staggered rectangular stacking is used to improve the array fabrication uniformity by mitigating the loading effects that may occur during mesa etch definition.

Thus, embodiments of the invention describe 2D VCSEL arrays fabricated with very high fill-factors, thereby enabling very high output power densities during pulsed, quasi-continuous wave (QCW), and continuous wave (CW) operation.

Figure 2:
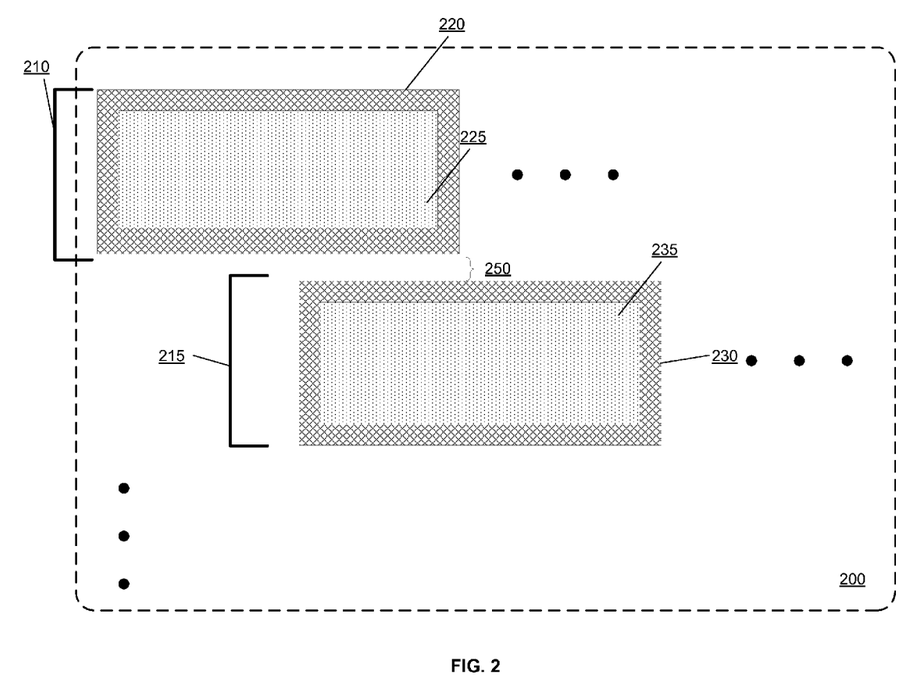
FIG. 2 is diagram of a 2D VCSEL array according to an embodiment of the invention.

FIG. 2 is diagram of a 2D VCSEL array according to an embodiment of the invention. Semiconductor region 200 may comprise semiconductor material suitable for VCSEL fabrication. In one embodiment, semiconductor region 200 comprises a crystal wafer.

Semiconductor region 200 includes first row of VCSELs 210 and second row of VCSELs 215, thereby forming a 2D array of VCSELs. Row 210 includes at least VCSEL 220, and row 215 includes a least VCSEL 230. It is to be understood that each of said row may each consist of only one VCSEL; however, in this embodiment rows 210 and 220 each comprise a plurality of VCSELs, and other embodiments may have substantially more rows in the 2D array, each row comprising a plurality of VCSELs.

VCSELs 220 and 230 include apertures 225 and 235 respectively. Said apertures are asymmetrical, in that each aperture's length is greater than its width (it is to be understood that the terms 'length' and 'width' merely identify the longer and shorter axis of the aperture, respectively, and are not meant to limit apertures to a specific orientation). Thus, in this example individual VCSELs in the array are comprised of rectangular shaped pillars and are arranged in a rectangular packing arrangement such that the width of current confinement separator 250 that separates each VCSEL is uniform and at a minimum. It is to be understood that current confinement separator 250 may comprise an etched trench, a row of etched holes to access and oxidize portions of an aperture layer, a line of implanted non-conductive material, or a combination of these elements.

Figure 3A:
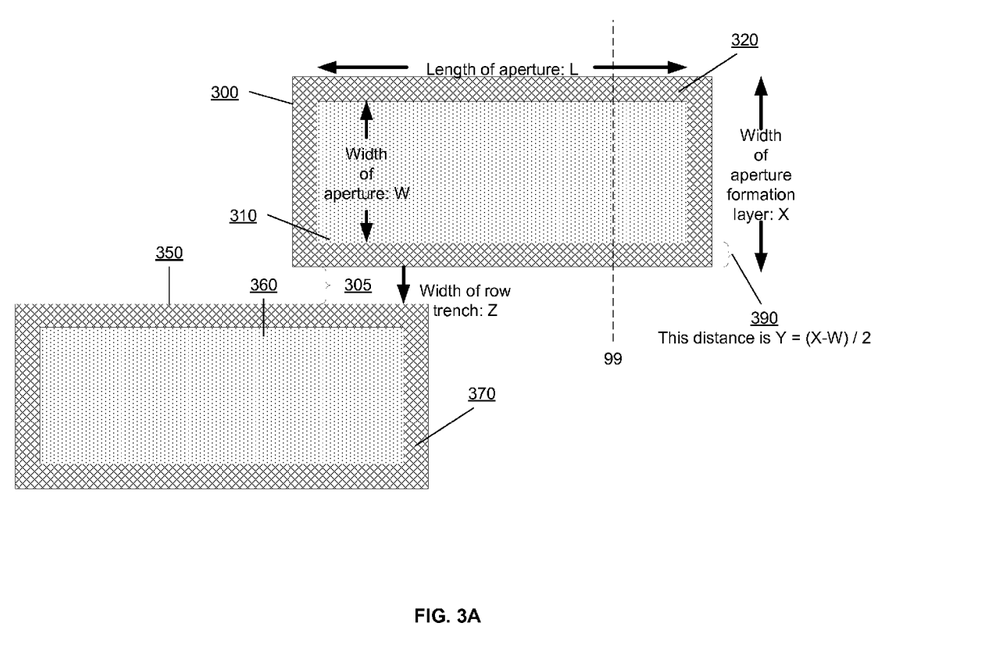
FIG. 3A is a diagram of two adjacent VCSELs included in a 2D array of VCSELs according to an embodiment of the invention.

FIG. 3A illustrates two adjacent VCSELs included in a 2D array of VCSELs according to an embodiment of the invention. In this example embodiment, VCSELs 300 and 350 are to be understood as having the same dimensions.

VCSEL 300 includes aperture 310, having a length L and a width W. The length of aperture 310 is only physically limited by the length of the chip/wafer including the 2D array of VCSELs. Because length L is independent of width W, aperture widths below 10 µm may be utilized in some embodiments and still achieve a fill-factor greater than 30%. This constitutes a new capability in high power VCSELs and will allow power scaling to increase beyond the current state-of-the-art. The ratio of L to W should be at least 2:1 in order to substantively increase fill-factor. In some embodiments, W is minimized such that maximum efficiency and device performance occurs as a result of optimum lateral current injection (i.e., minimal current injection distance from the metal contacts to the active region), optimum lateral heat extraction from the center of the aperture, and optimum confinement of the electrical current and optical mode of the respective VCSEL. In some embodiments, the ratio of L to W is 4:1; however, it is to be understood that the length dimension of the rectangular aperture may be increased to increase fill-factor to suit the desired application, and may be as long as the overall chip dimension.

Figure 3B:
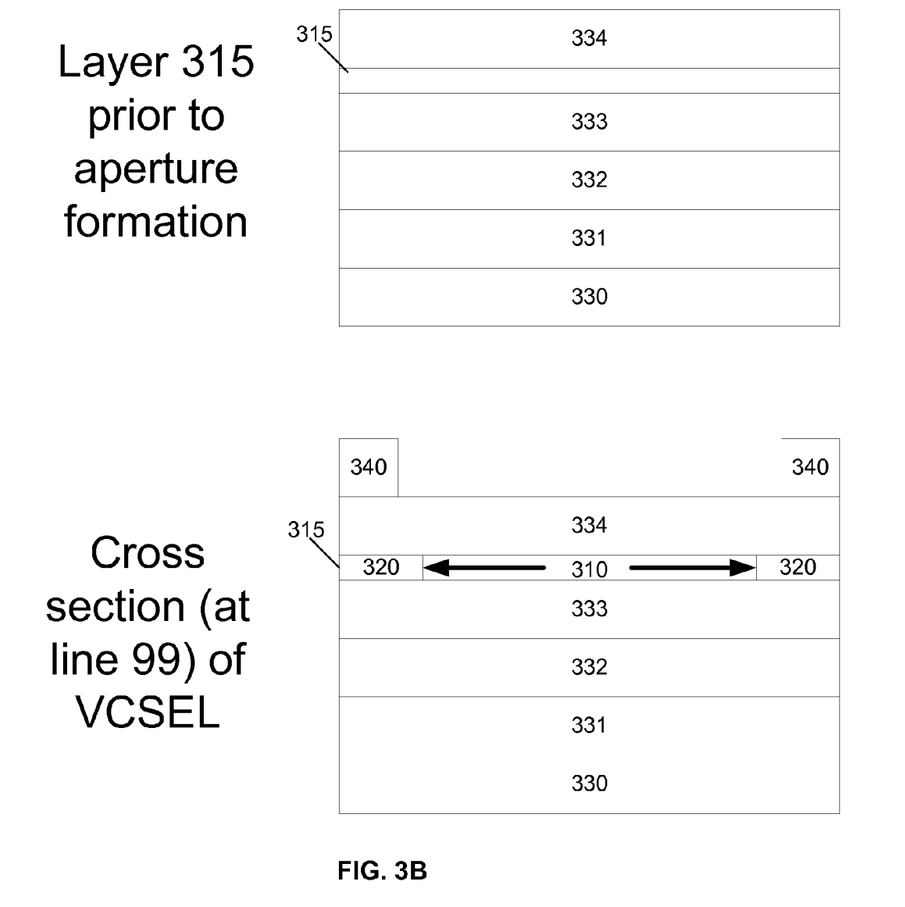
FIG. 3B is a diagram of a cross-section of one of the VCSELs included in the 2D array.

The above ratios are required to increase the fill-factor of VCSEL arrays having a metal electrode in a ring configuration, as illustrated by electrode 340 in FIG. 3B. VCSELs 300 and 350 are top-emitting VCSELs. Other embodiments of the invention may utilize bottom emitting VCSELs. It is to be understood that in a bottom emitting configuration, very dense packing using this preferred embodiment requires the substrate to be removed or substantially thinned in order to allow for both anode and cathode metal contacts to be deposited on the semiconductor device without blocking the light emission aperture. Substrate removal is required due to the high fill-factors and beam expansion.

In this example, VCSEL 300 comprises (illustrated by a cross section at line 99 as shown in FIG. 3B) semiconductor substrate 331, complementary electrodes 330 and 340, $1^{st}$ and $2^{nd}$ Distributed Bragg Reflectors (DBRs) 332 and 334, active region 333, and aperture formation layer 315 that includes aperture 310. Aperture formation layer 315 may comprise, for example, an ion implantation layer, an oxide layer, or any functional equivalent wherein portions 320 of said layer are processed (e.g., oxidized) in order to form aperture 310. In this embodiment, the difference between the width of aperture formation layer 315 and aperture 310 is the value X-W.

In this example, apertures 310 and 360 are separated by row trench 305 (having a width of Z) and processed portions of the aperture formation layers forming said apertures (i.e., items 320 and 370). It is to be understood that, presuming substantially identical VCSEL dimensions for each of VCSELs 300 and 350, the distance between apertures 310 and 360 is Z (width of row trench 305) plus two times the width of region 390 having a dimension of Y one half the difference between the width of aperture formation layer 315 and aperture 310 (i.e., (X−W)/2). Thus, in this example embodiment, the distance between apertures 310 and 360 may be expressed as 2Y+Z.

It is to be understood that the fill factor of VCSEL arrays in embodiments of the invention will vary depending on the size of the apertures and the distance between the apertures. In the example embodiment illustrated in FIG. 3A, the ratio of the widths of apertures 310 and 360 (i.e., the short dimension of the asymmetrical apertures) to the distance between apertures 310 and 360 may be expressed as W:(2Y+Z).

Assuming aperture widths ranging from 5 µm-15 µm, the ratio W:(2Y+Z) for embodiments of the invention utilizing relatively large aperture formation layer widths and trenches, e.g., wherein the values of Y and Z are 10 µm, will range from 1:6—i.e., 5 µm:((2×10 µm)+10 µm), to 1:2—i.e., 15 µm:((2× 10 µm)+10 µm).

Again assuming aperture widths ranging from 5 µm-15 µm, the ratio W:(2Y+Z) for embodiments of the invention utilizing relatively small aperture formation layer widths and trenches, e.g., wherein the values of Y and Z are 3 µm, will range from 5:9—i.e., 5 µm:((2×3 µm)+3 µm), to 5:3—i.e., 15 µm:((2×3 µm)+3 µm). It is to be understood that utilizing even smaller aperture formation layer widths and trenches may increase both the ratio W:(2Y+Z) and the fill factor of VCSEL pixels in an array.

As discussed above, the fill-factor of VCSEL pixels in an array may be increased by utilizing VCSELs with extremely large apertures, but smaller pixels may be preferred because larger pixels are thermally inefficient. Thus, for embodiments of the invention utilizing smaller pixels, the ratio W:(2Y+Z) may be at most 2:1. It is to be understood that in some embodiments of the invention, the ratio W:(2Y+Z) may be larger if VCSELs with extremely large apertures are utilized.

Figure 4:
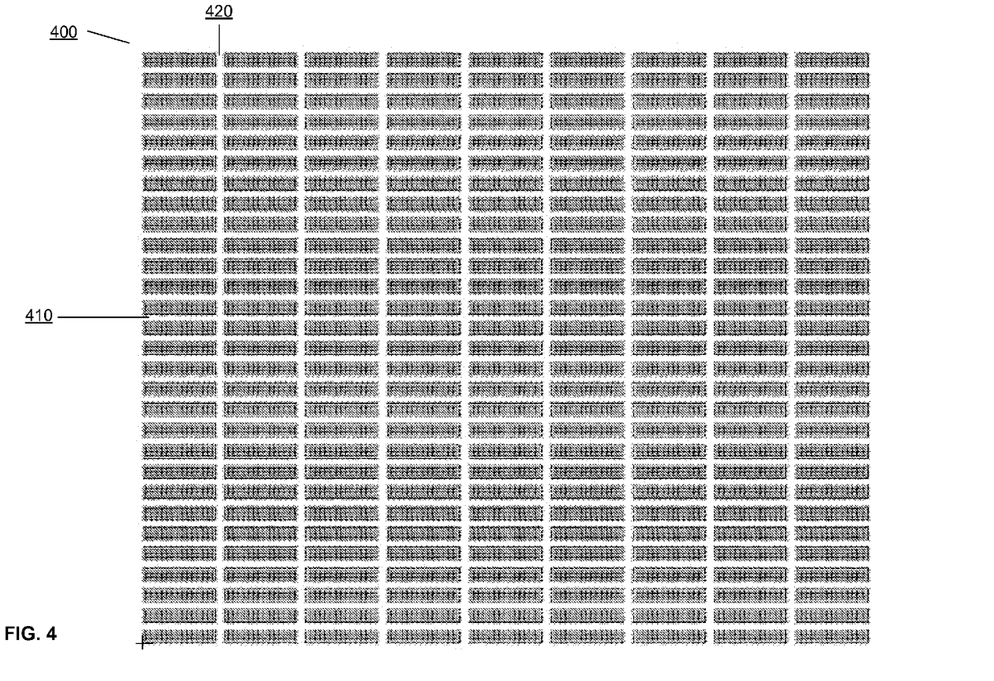
FIG. 4 is a diagram of an example packing scheme for rectangular VCSELs according to an embodiment of the invention.

FIG. 4. illustrates an example packing scheme for rectangular VCSELs according to an embodiment of the invention. The individual VCSELs in array 400 are comprised of rectangular shaped pillars and are arranged in a rectangular packing arrangement such that the widths of the trenches of array 400 that separate each device, including trenches 410 and 420, are uniform and at a minimum. It is to be understood that, in this embodiment, the asymmetrical apertures of array 400 allow for a larger fraction of the area of array 400 to be filled with light emitting electrically pumped active region material (as this is affected by the longer length of the aperture) while still maintaining the shortest possible length of current injection to the center of each aperture and waste heat extraction from the center of each aperture (as this is affected by the shorter width of the aperture).

Figure 5:
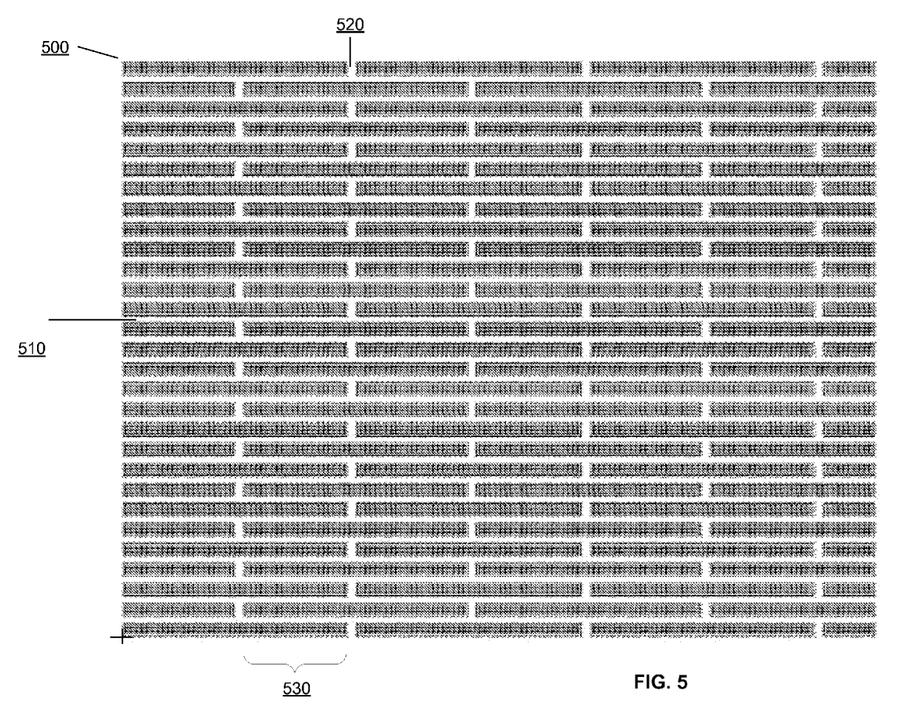
FIG. 5 is a diagram of an example packing scheme for rectangular VCSELs according to an embodiment of the invention.

FIG. 5 illustrates an alternative embodiment for packing rectangular shaped pillars to further increase the fill-factor of a VCSEL array. In this alternative embodiment, the rectangular pillars of array 500 are still arranged in a rectangular packing arrangement such that the widths of trenches 510 and 520 that separate each device is uniform and at a minimum; however, the individual VCSELs of array 500 are packed in a brick or staggered style scheme—i.e., consecutive rows of VCSELs are offset by value 530. In this embodiment, value 530 is half the value of the VCSEL length; however, any offset may be employed in other embodiments.

The VCSEL arrangement of array 500 has the added benefit of improving manufacturing control by minimizing loading effects during the mesa etch definition (i.e., trench etch definition). In this embodiment, the corner of a rectangular pillar is now only met with one other corner and the straight edge of the adjacent pillars (as opposed to four corners of adjacent pillars). This minimizes the etched area at each of corners, improving etch depth uniformity when defining the trench. Thus, the embodiment illustrated by FIG. 5 further minimizes the trench width of the array, and thereby increases the fill-factor.

Increasing the fill-factor using the embodiments of the invention has additional benefits in manufacturing control. It is understood that in semiconductor processing it is desirable to have planar topography in order to achieve photoresist planarity, which provides improved lithography resolution, process uniformity, and process control. One drawback of circular or square pillars is the sparseness of the top unetched surface area. One approach that has been used to solve this issue and to have mostly unetched, or raised, surface area, is to use an arrangement of etches holes positioned such that after oxidation, only the desired VCSEL aperture passed current. This has the limitations of a resulting low fill-factor due the necessary long oxidation lengths required to define the lasing and non-lasing areas.

Using the packing scheme illustrated in this embodiment with, for example, an aperture width dimension of 7 μm with a 5 μm oxide length and 5 μm trench width, the amount of top unetched surface area asymptotically approaches over 75% fill-factor as the length dimension increases indefinitely, or more realistically, towards the overall size of the array 500. It is to be understood that this top unetched surface area fill-factor is more than the 60% fill-factor achievable from a square pillar in a square packing arrangement and more than the 47% fill-factor achievable from a circular pillar in a square packing arrangement for similar aperture, oxide, and trench dimensions.

Figure 6:
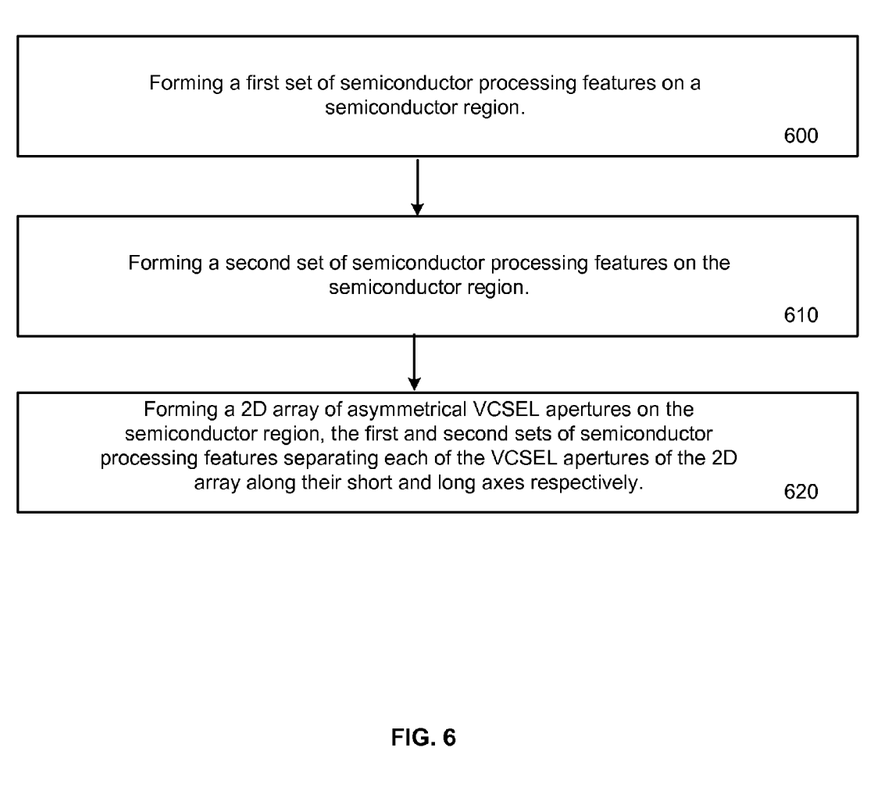
FIG. 6 is a flow diagram illustrating a process to form a 2D VCSEL array according to an embodiment of the invention.

FIG. 6 is a flow diagram illustrating a process to form a 2D VCSEL array according to an embodiment of the invention.

Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

A first set of semiconductor processing features are formed on a semiconductor region, 600. A second set of semiconductor processing features are formed on the semiconductor region, 610. These semiconductor features may subsequently include, for example, features to access aperture formation layers in order to form apertures as described above (e.g., the features may be a row of etched trenches to access and oxidize portions of the aperture formation layer).

A 2D array of VCSEL apertures are thus formed on the semiconductor region by the first and second semiconductor processing features, 620. Each aperture has a length along a long axis of the aperture and a width along a short axis of the aperture. In one embodiment, the ratio of the length to the width is between 2:1 and 4:1, and at least 10% of a surface area of the semiconductor region comprises surface areas of the formed VCSEL apertures. In other embodiments, at least 25% of the surface area of the semiconductor region comprises surface areas of the formed VCSEL apertures. As discussed above, the amount of the surface area of the semiconductor region that comprises surface areas of the formed VCSEL apertures may be increased by reducing the size of said semiconductor features and/or increasing aperture width and/or length. Each of the VCSEL apertures may comprise a relatively rectangular shape, a relatively oval shape, or a polygon of non-parallel sides, the sides angled to suppress in-plane optical feedback.

The first set of semiconductor processing features may, for example, separate each of the VCSEL apertures of the 2D array along their short axes, while the second set of semiconductor processing features separate the VCSEL apertures along their long axes. The semiconductor processing features separating the VCSEL apertures along their long axes have a length that is the same value, or a different value, as the width of the semiconductor processing features separating each of the VCSEL apertures of the 2D array along their short axes. In one embodiment, the ratio of the aperture width to the width of the semiconductor processing features separating each of the VCSEL apertures of the 2D array along their short axes may be at most 2:1. The semiconductor processing features separating the VCSEL apertures along their long axes and included in consecutive rows of the 2D array may aligned or offset (e.g., in a brick format) as described above.

Figure 7:
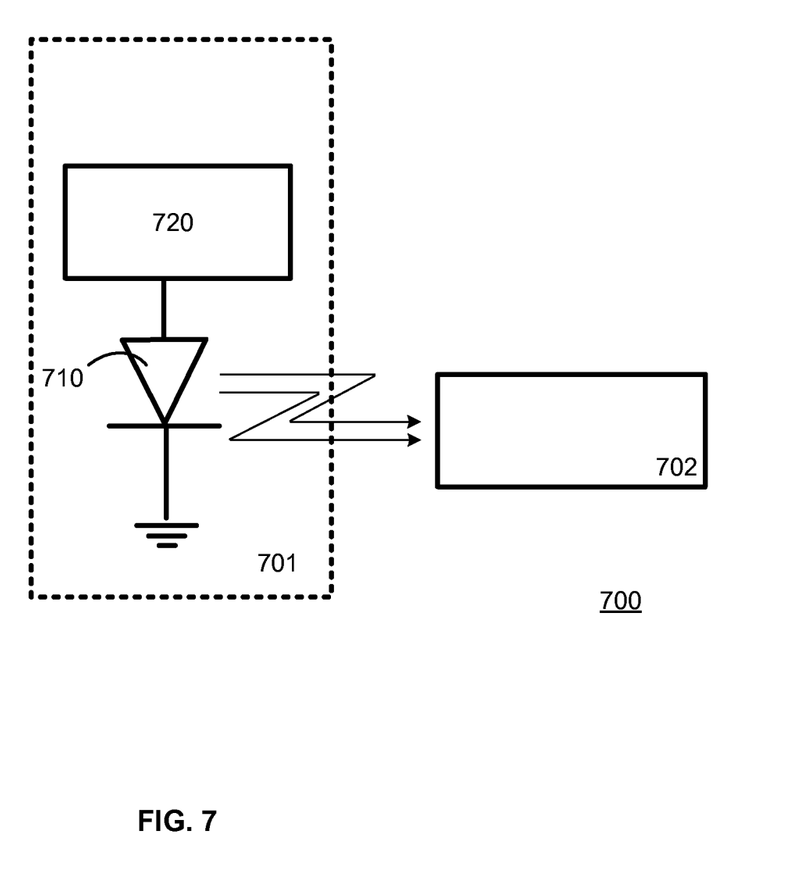
FIG. 7 is a block diagram of a simplified optical system utilizing an embodiment of the invention.

FIG. 7 is a block diagram of a simplified optical system utilizing an embodiment of the invention. System 700 includes transmitter 701 and target device 702. Transmitter 701 includes light source 710 and light source controller 720. In the illustrated embodiment, light source 710 may be a 2D VCSEL array comprising any embodiment of the invention described above. Light source controller 720 may collectively or separately control the VCSELs of light source 710 (i.e., light source controller 720 may create an electrical difference at electrical contacts of each of the VCSELs of light source 710). Light source 710 may transmit light to target device 702 via any transmission medium known in the art.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus comprising:
a semiconductor region;
a first row of at least one vertical-cavity surface emitting laser (VCSEL) formed on the semiconductor region; and
a second row of at least one VCSEL formed on the semiconductor region and separated from the first row by a current confinement separator; wherein
each VCSEL includes an output aperture having a length and a width,
a ratio of the aperture length to the aperture width is in a range of 2.5:1 to at least 4:1,
a ratio of the aperture width to a distance between apertures of the VCSEL(s) of the first and second row is at most two-to-one, and
at least 10% of a surface area of the semiconductor region corresponds to surface areas of the apertures of the first and second row of VCSEL(s).

2. The apparatus of claim 1, wherein the current confinement separator comprises a row trench, and each VCSEL further includes an aperture layer forming the aperture and having a width greater than the width of the aperture by a first value, wherein a ratio of the aperture width to the sum of the first value and a width of the row trench is at most two-to-one.

3. The apparatus of claim 1, wherein the ratio of the aperture length to the aperture width is at least four-to-one.

4. The apparatus of claim 1, wherein at least 25% of the surface area of the semiconductor region corresponds to surface areas of the apertures of the first and second row of VCSEL(s).

5. The apparatus of claim 1, wherein the first and second row of VCSEL(s) each comprise a plurality of VCSELs separated by a column trench.

6. The apparatus of claim 5, wherein the column trench of the first row of VCSELs is aligned with the column trench of the second row of VCSELs.

7. The apparatus of claim 5, wherein the column trench of the first row of VCSELs is offset with respect to the column trench of the second row of VCSELs.

8. The apparatus of claim 5, wherein a length of the column trench is not equal to the width of the row trench.

9. The apparatus of claim 1, wherein each aperture of the VCSEL(s) of the first and second row comprises a relatively rectangular shape.

10. The apparatus of claim 1, wherein each aperture of the VCSEL(s) of the first and second row comprises a relatively oval shape.

11. The apparatus of claim 1, wherein each aperture of the VCSEL(s) of the first and second row comprises a polygon of non-parallel sides, the sides angled to suppress in-plane optical feedback.

* * * * *